(12) United States Patent  
Mimura et al.

(10) Patent No.: US 11,791,182 B2
(45) Date of Patent: Oct. 17, 2023

(54) MEASURING METHOD AND MEASURING DEVICE

(71) Applicant: Tokyo Electron Limited, Tokyo (JP)

(72) Inventors: Yuji Mimura, Koshi (JP); Shigeto Tsuruta, Koshi (JP); Eiji Manabe, Koshi (JP); Hisanori Hizume, Sapporo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 372 days.

(21) Appl. No.: 17/049,645

(22) PCT Filed: Apr. 10, 2019

(86) PCT No.: PCT/JP2019/015547
§ 371 (c)(1),
(2) Date: Oct. 22, 2020

(87) PCT Pub. No.: WO2019/208214
PCT Pub. Date: Oct. 31, 2019

(65) Prior Publication Data
US 2021/0249287 A1    Aug. 12, 2021

(30) Foreign Application Priority Data

Apr. 23, 2018  (JP) ................. 2018-082376

(51) Int. Cl.
*H01L 21/67* (2006.01)
*G01N 21/95* (2006.01)
(Continued)

(52) U.S. Cl.
CPC ... *H01L 21/67259* (2013.01); *G01N 21/9501* (2013.01); *G06T 7/0004* (2013.01); *H01L 21/6875* (2013.01); *G06T 2207/30204* (2013.01)

(58) Field of Classification Search
CPC ...... G01N 21/9501; G06T 2207/30204; G06T 7/0004; H01L 21/67092; H01L 21/67259;
(Continued)

(56) References Cited

U.S. PATENT DOCUMENTS 9,097,681 B2 *   8/2015  Koga ................. G01N 21/9505
2010/0139836 A1 * 6/2010  Horikoshi ............. H01L 23/544
                                                        156/64

FOREIGN PATENT DOCUMENTS

JP     2003-279497 A    10/2003
JP     2013-115384 A     6/2013
JP     2018-004378 A     1/2018

OTHER PUBLICATIONS

International Search report for PCT/JP2019/015547 dated Jun. 4, 2019.

* cited by examiner

*Primary Examiner* — Tri T Ton
(74) *Attorney, Agent, or Firm* — Pearne & Gordon LLP

(57) ABSTRACT

A measuring method includes measuring a displacement A1, placing an imaging unit 20 at a position where the imaging unit is allowed to image a measurement mark MI and imaging the measurement mark M1. In the measuring of the displacement A1, the displacement A1 of a surface of a combined substrate, which is composed of two sheets of substrates bonded to each other, on a side of the imaging unit 20 at a position where the measurement mark M1 for position deviation measurement, which is provided within the combined substrate, is placed is measured. In the imaging of the measurement mark M1, the measurement mark M1 is imaged by the imaging unit 20 while putting the measurement mark M1 in focus by moving a focal position back and forth with respect to a focal position which is previously set based on the displacement A1.

6 Claims, 13 Drawing Sheets

(51) Int. Cl.
*G06T 7/00* (2017.01)
*H01L 21/687* (2006.01)

(58) Field of Classification Search
CPC ... H01L 21/681; H01L 21/6875; H01L 21/02; H01L 21/187; H01L 21/67294
USPC .................. 356/507–510, 138–155, 614–640
See application file for complete search history.

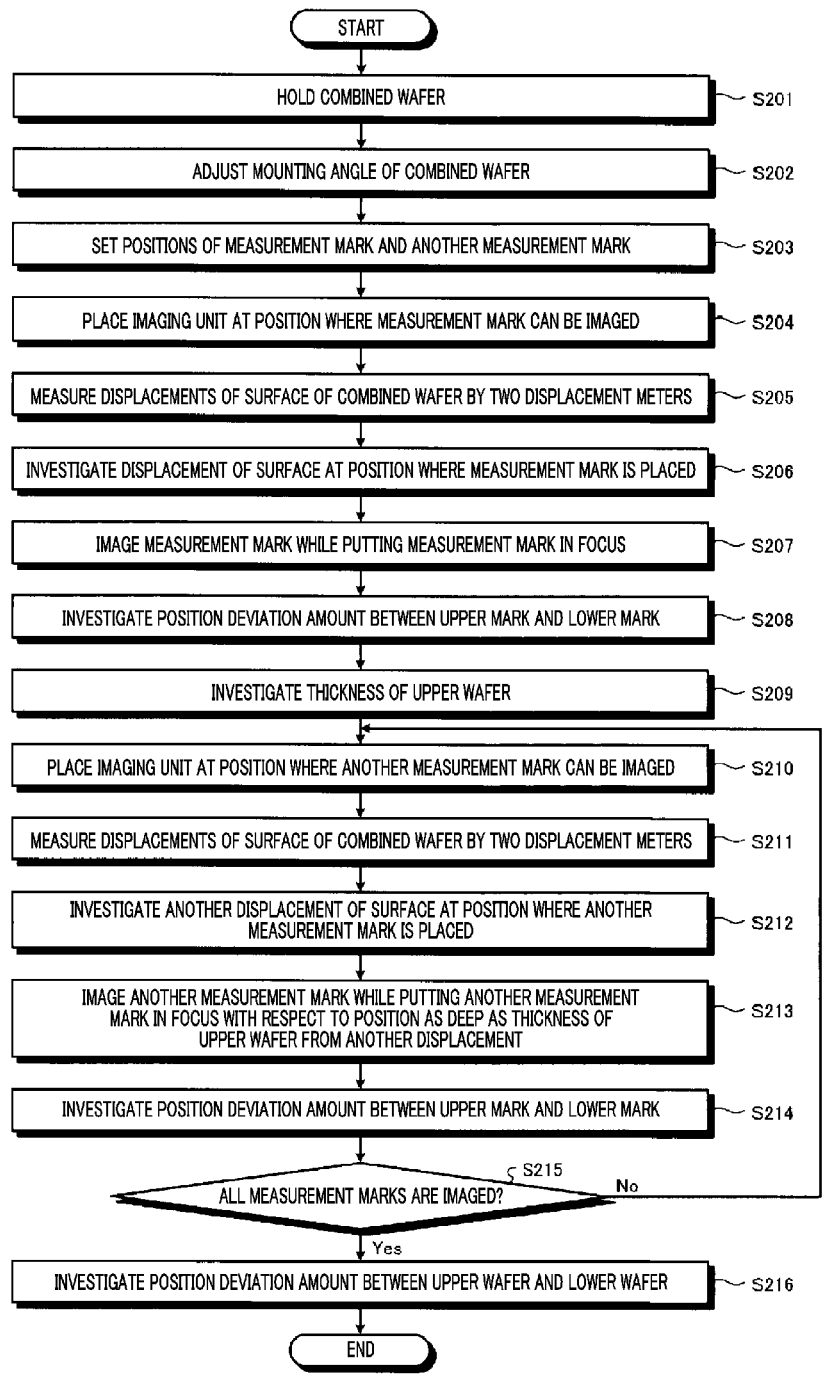

MEASURING METHOD AND MEASURING DEVICE

CROSS-REFERENCE TO RELATED APPLICATION

This Application is a U.S. national phase application under 35 U.S.C. § 371 of PCT Application No. PCT/JP2019/015547 filed on Apr. 10, 2019, which claims the benefit of Japanese Patent Application No. 2018-082376 filed on Apr. 23, 2018, the entire disclosures of which are incorporated herein by reference.

TECHNICAL FIELD

The various aspects and embodiments described herein pertain generally to a measuring method and a measuring device.

BACKGROUND

Conventionally, as a way to bond substrates such as semiconductor wafers, there is known a method in which to-be-bonded surfaces of the substrates are modified, the modified surfaces of the substrates are hydrophilized, and the hydrophilized surfaces are bonded by a Van der Waals force and a hydrogen bond (intermolecular force). Further, there is also known a method in which a mark (hereinafter, referred to as "measurement mark") for measurement of a position deviation is provided within the bonded substrates, and a position deviation amount between the bonded substrates is investigated by imaging this measurement mark (see, for example, Patent Document 1).

Patent Document 1: Japanese Patent Laid-open Publication No. 2013-115384

SUMMARY

In an exemplary embodiment, a measuring method includes measuring a displacement, placing an imaging unit at a position where the imaging unit is allowed to image a measurement mark and imaging the measurement mark. In the measuring of the displacement, the displacement of a surface of a combined substrate, which is composed of two sheets of substrates bonded to each other, on a side of the imaging unit at a position where the measurement mark for position deviation measurement, which is provided within the combined substrate, is placed is measured. In the imaging of the measurement mark, the measurement mark is imaged by the imaging unit while putting the measurement mark in focus by moving a focal position back and forth with respect to a focal position which is previously set based on the displacement.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 10 is a flowchart illustrating a processing sequence of a processing performed by a measuring device according to a modification example of the exemplary embodiment.

DETAILED DESCRIPTION

Hereinafter, exemplary embodiments of a measuring method and a measuring device according to the present disclosure will be described in detail with reference to the accompanying drawings. The present disclosure is not limited to the exemplary embodiments to be described below. Further, it should be noted that the drawings are schematic and relations in sizes of individual components and ratios of the individual components may sometimes be different from actual values. Even between the drawings, there may exist parts having different dimensional relationships or different ratios.

Conventionally, as a way to bond substrates such as semiconductor wafers, there is known a method in which to-be-bonded surfaces of the substrates are modified, the modified surfaces of the substrates are hydrophilized, and the hydrophilized surfaces are bonded by a Van der Waals force and a hydrogen bond (intermolecular force).

Further, there is also known a method in which a mark (hereinafter, referred to as "measurement mark") for measurement of a position deviation is provided within the bonded substrates, and a position deviation amount between the bonded substrates is investigated by imaging this measurement mark. In order to image the measurement mark clearly for the purpose of investigating the position deviation amount accurately, this measurement mark is imaged by a high magnification imaging unit having a shallow depth of focus.

Meanwhile, the measurement mark is provided within the combined substrate, and a depth to this measurement mark (that is, a thickness of the substrate at an upper side) varies depending on the combined substrate. That is, to image the measurement mark while putting it in focus, the imaging needs to be performed several times while moving the depth of focus back and forth in a wide range. As a result, in the method of measuring the position deviation amount of the combined substrate, it takes a lot of time to image the measurement mark while focusing on it.

In this regard, it is required to efficiently focus on the measurement mark which is provided within the combined substrate.

<Outline of Measuring Device>

Figure 1:
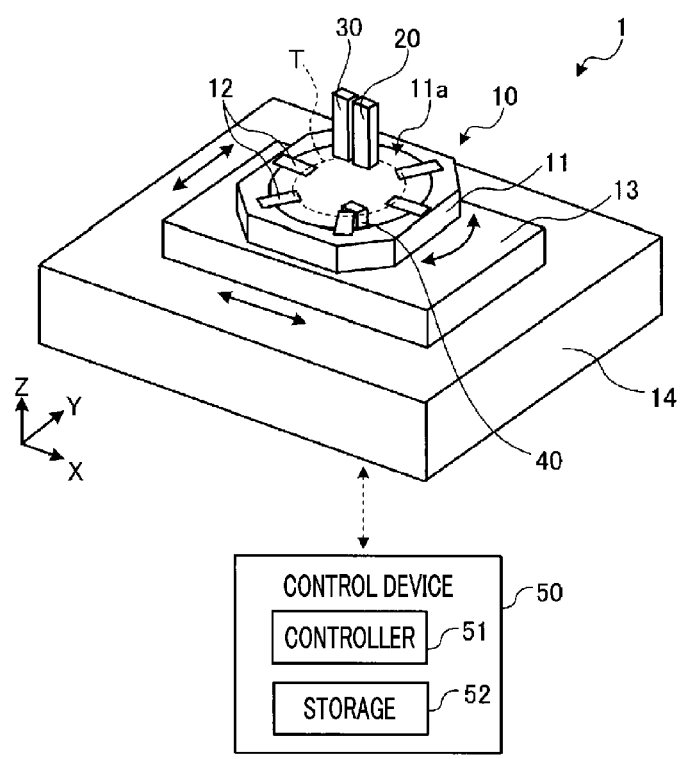
FIG. 1 is a perspective view illustrating a schematic configuration of a measuring device according to an exemplary embodiment.

First, referring to FIG. 1, a schematic configuration of a measuring device 1 according to an exemplary embodiment will be explained. FIG. 1 is a perspective view illustrating a schematic configuration of the measuring device 1 according to the exemplary embodiment. In the following, in order to clarify positional relationships, the X-axis, Y-axis and Z-axis which are orthogonal to each other will be defined, and the positive Z-axis direction will be regarded as a vertically upward direction.

As depicted in FIG. 1, the measuring device 1 includes a substrate holder 10, an imaging unit 20, a displacement meter 30, a light source 40, and a control device 50. Further, though not shown in FIG. 1, the measuring device 1 further includes a lifter 60 (see FIG. 3A), and a supply arm (see FIG. 3C). Details of the lifter 60 and the supply arm 70 will be described later.

The substrate holder 10 includes a main body 11, a multiple number of holding arms 12, a horizontal mover 13, and a placing table 14. The main body 11 is of an annular shape, and has a circular opening 11a at a central portion thereof. As shown in FIG. 1, the opening 11a is larger than a combined wafer T which is held by the substrate holder 10.

The multiple number of holding arms 12 are elongated inwards into the opening 11a from the main body 11. Since a non-illustrated vacuum chuck mechanism is provided at a leading end of each holding arm 12, the holding arms 12 are respectively configured to hold a peripheral portion of the combined wafer T (for example, a range of 12 mm inwards from an end of the combined wafer T). By way of example, the multiple number of (six in the present exemplary embodiment) holding arms 12 are arranged at a substantially regular distance therebetween in a circumferential direction of the opening 11a.

The main body 11 having this opening 11a and the holding arms 12 is provided on the horizontal mover 13, and configured to be rotatable on this horizontal mover 13. The horizontal mover 13 is provided on the placing table 14, and configured to be movable in horizontal directions (the X-axis direction and the Y-axis direction) on the placing table 14.

That is, the substrate holder 10 is capable of holding the combined wafer T with the multiple number of holding arms 12 such that the combined wafer T is suspended, and is also capable of rotating and moving the held combined wafer T horizontally. As stated above, in the measuring device 1 according to the exemplary embodiment, since the combined wafer T can be maintained in the suspended state, it is possible to image a wide region of the combined wafer T including a central portion thereof by adopting a method of transmitting infrared light.

The imaging unit 20 is disposed at one side (for example, a top side) of the combined wafer T held by the substrate holder 10, and configured to image a measurement mark M (see FIG. 2) provided within the combined wafer T. By way of example, the imaging unit 20 is equipped with a low magnification (for example, 10 times) macro camera with a deep depth of focus and a high magnification (for example, 50 times) micro camera with a shallow depth of focus.

Between the two cameras provided in the imaging unit 20, the macro camera is configured to image macro marks MM1 and MM2 (see FIG. 4A) which are provided for adjustment of a mounting angle of the combined wafer T, for example. Further, the micro camera is configured to image the measurement mark M provided for measurement of a position deviation of the combined wafer T.

The displacement meter 30 is disposed at the same side (for example, the top side) as the imaging unit 20 with respect to the combined wafer T held by the substrate holder 10, and configured to measure a displacement of a surface of the combined wafer T at the imaging unit 20 side. This displacement meter 30 is placed adjacent to the imaging unit 20 (for example, 20 mm to 30 mm apart from the imaging unit 20). The displacement meter 30 is, by way of non-limiting example, a laser displacement meter.

The light source 40 is disposed at an opposite side (for example, a bottom side) from the imaging unit 20 with respect to the combined wafer T held by the substrate holder 10, and configured to radiate infrared light penetrating the inside of the combined wafer T to the combined wafer T. The light source 40 is, by way of non-limiting example, a halogen lamp.

When the combined wafer T is composed of silicon wafers, it is desirable that a wavelength of the infrared light radiated from the light source 40 is in a range from about 1100 nm to about 1600 nm to obtain a high transmittance in the combined wafer T.

The control device 50 is, for example, a computer, and includes a controller 51 and a storage 52. A program for controlling various kinds of processings performed in the measuring device 1 is stored in the storage 52. The controller 51 controls an operation of the measuring device 1 by reading and executing the program stored in the storage 52.

The program is recorded on a computer-readable recording medium, and may be installed from the recording medium to the storage 52 of the control device 50. The computer-readable recording medium may be, by way of non-limiting example, a hard disk (HD), a flexible disk (FD), a compact disk (CD), a magnet optical disk (MO), a memory card, or the like.

<Structure of Combined Wafer and Measurement Mark>

Figure 2:
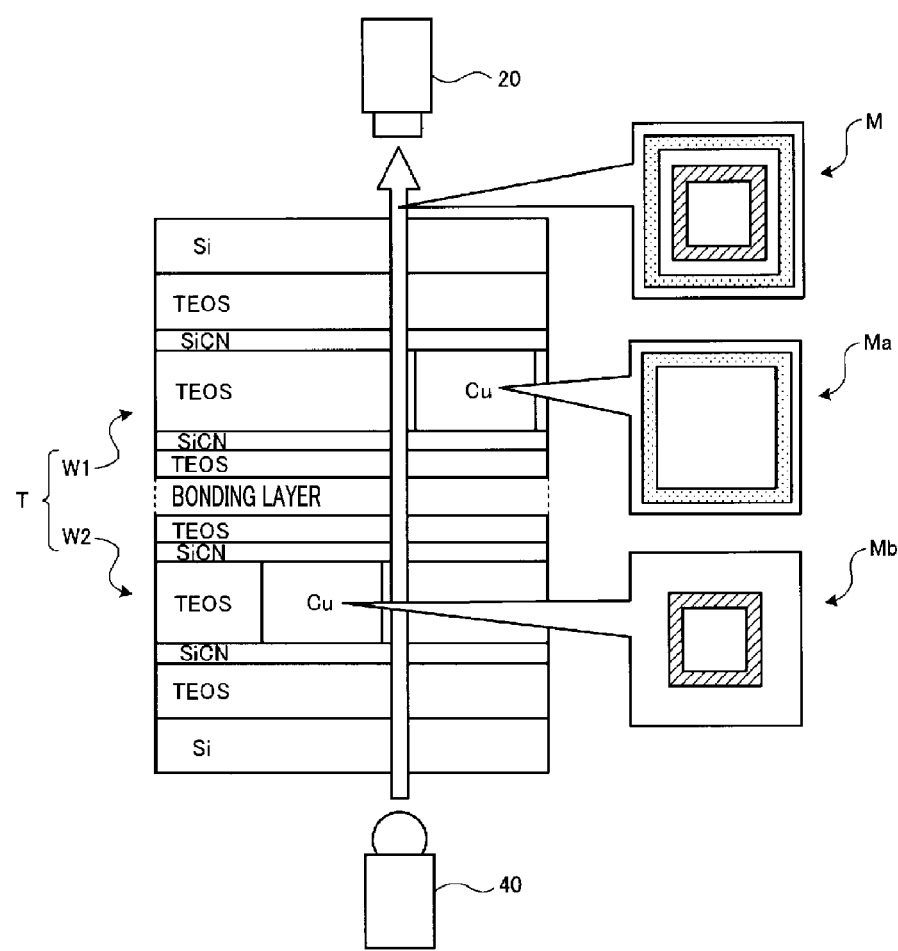
FIG. 2 is a schematic diagram illustrating a structure of a combined wafer and a measurement mark according to the exemplary embodiment.

Now, a structure of the combined wafer T according to the exemplary embodiment will be explained with reference to FIG. 2. FIG. 2 is a diagram illustrating the structure of the combined wafer T and the measurement mark M according to the exemplary embodiment.

As shown in FIG. 2, the combined wafer T is formed by bonding a first substrate W1 and a second substrate W2 with a bonding layer therebetween. The first substrate W1 is, for example, a semiconductor substrate such as a silicon wafer on which multiple electronic circuits are formed. Further, the second substrate W2 is, for example, a bare wafer on which no electronic circuit is formed. The first substrate W1 and the second substrate W2 have a substantially same diameter. Further, the second substrate W2 may have an electronic circuit formed thereon.

In the following, the first substrate W1 will be referred to as "upper wafer W1," and the second wafer W2 will be referred to as "lower wafer W2." That is, the upper wafer W1 is an example of the first substrate, and the lower wafer W2 is an example of the second substrate.

A preset multilayered film composed of a TEOS film and a SiCN film is formed on a bonding surface (that is, a bottom surface) of the upper wafer W1 and a bonding surface (that is, a top surface) of the lower wafer W2. The TEOS film is formed by a chemical vapor deposition (CVD) method by using tetraethoxysilane (TEOS) as a Si precursor.

Further, an upper mark Ma made of Cu or the like is formed within the multilayered film formed on the bonding surface of the upper wafer W1, and a lower mark Mb made of Cu or the like is formed within the multilayered film formed on the bonding surface of the lower wafer W2. By way of example, both the upper mark Ma and the lower mark Mb have a substantially box shape when viewed from the top. Further, shapes of the upper mark Ma and the lower mark Mb are substantially similar to each other, and the upper mark Ma is larger than the lower mark Mb. Here, however, the shapes of the upper mark Ma and the lower mark Mb are not limited to the example shown in FIG. 2.

The infrared light is radiated from the light source 40 which is disposed at the one side (for example, the bottom side) of the combined wafer T, and the upper mark Ma and the lower mark Mb are imaged by the imaging unit 20 which is disposed at the opposite side (for example, the top side) of the combined wafer T by using the infrared light. Accordingly, the imaging unit 20 is capable of imaging the measurement mark M in a state in which the upper mark Ma and the lower mark Mb are superposed.

The measuring device 1 calculates a position deviation amount between the upper mark Ma and the lower mark Mb in the imaged measurement mark M, thus capable of investigating a position deviation amount between the upper wafer W1 and the lower wafer W2.

<Transfer Processing for Combined Wafer>

Figure 3A:
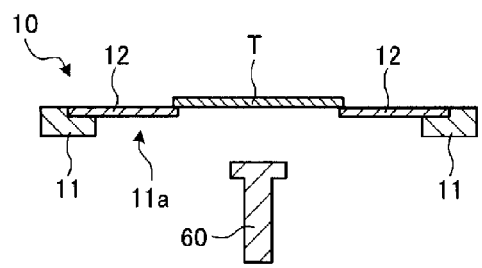
FIG. 3A is a first diagram for describing a combined wafer transfer processing according to the exemplary embodiment.

Now, a transfer processing for the combined wafer T in the measuring device 1 will be elaborated with reference to FIG. 3A to FIG. 3F. FIG. 3A to FIG. 3F are first to sixth diagrams for describing the transfer processing for the combined wafer according to the exemplary embodiment. FIG. 3A illustrates a state upon the completion of measurement of the position deviation amount in the combined wafer T held by the substrate holder 10.

As depicted in FIG. 3A, the lifter 60 is provided under the combined wafer T held by the substrate holder 10. This lifter 60 is configured to be moved in a vertical direction and a horizontal direction. Further, a non-illustrated vacuum chuck mechanism is provided at an upper end portion of the lifter 60, and the lifter 60 is configured to hold the combined wafer T from below it.

Figure 3B:
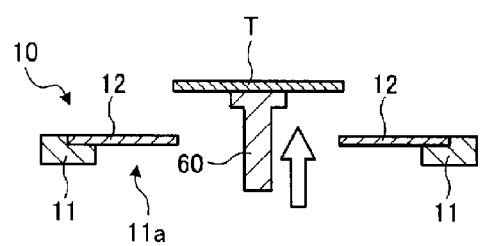
FIG. 3B is a second diagram for describing the combined wafer transfer processing according to the exemplary embodiment.
Figure 3C:
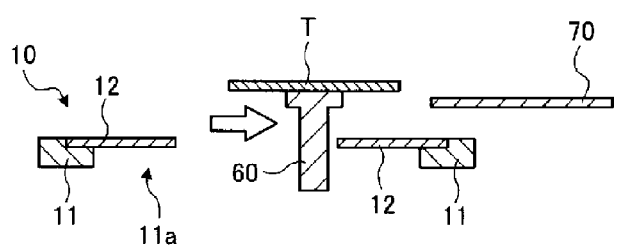
FIG. 3C is a third diagram for describing the combined wafer transfer processing according to the exemplary embodiment.

Then, as shown in FIG. 3B, the controller 51 moves the lifter 60 upwards, thus allowing the combined wafer T after being subjected to the measurement to be transferred to a position above the substrate holder 10. Further, as depicted in FIG. 3C, the controller 51 moves the lifter 60 in the horizontal direction, thus allowing the combined wafer T after being subjected to the measurement to approach the supply arm 70.

The supply arm 70 is provided adjacent to the main body 11 of the substrate holder 10 and configured to carry in/out the combined wafer T transferred by the lifter 60.

Figure 3D:
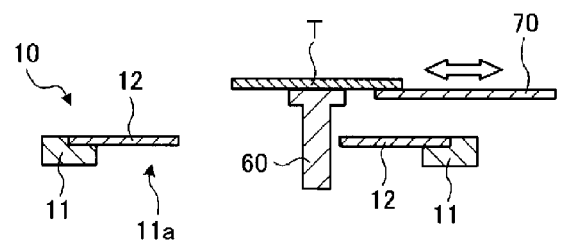
FIG. 3D is a fourth diagram for describing the combined wafer transfer processing according to the exemplary embodiment.

Next, as shown in FIG. 3D, by operating the supply arm 70, the controller 51 carries out the combined wafer T after being subjected to the measurement from the lifter 60 and places a combined wafer T to be measured next on the lifter 60.

Figure 3E:
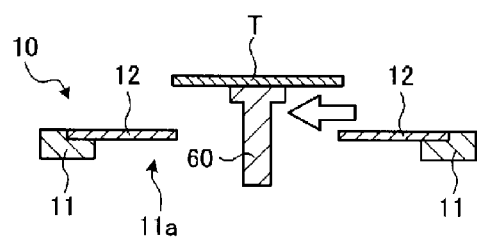
FIG. 3E is a fifth diagram for describing the combined wafer transfer processing according to the exemplary embodiment.

Then, as depicted in FIG. 3E, the controller 51 moves the lifter 60 in the horizontal direction, thus allowing the combined wafer T to be measured to a position above the central portion of the main body 11 of the substrate holder 10.

Figure 3F:
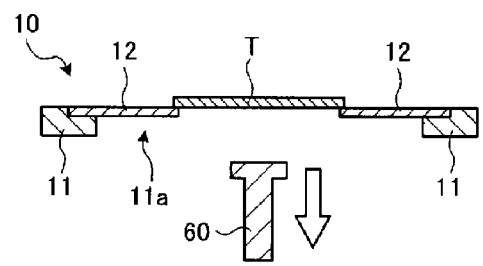
FIG. 3F is a sixth diagram for describing the combined wafer transfer processing according to the exemplary embodiment.

Thereafter, as illustrated in FIG. 3F, the controller 51 moves the lifter 60 downwards, thus allowing the combined wafer T to be measured to be placed on the holding arms 12 of the substrate holder 10. Finally, the controller 51 operates the vacuum chuck mechanisms of the holding arms 12, thus allowing the combined wafer T to be measured to be firmly held on the holding arms 12, and the transfer processing for the combined wafer T is completed.

<Mounting Angle Adjusting Processing for Combined Wafer>

Figure 4A:
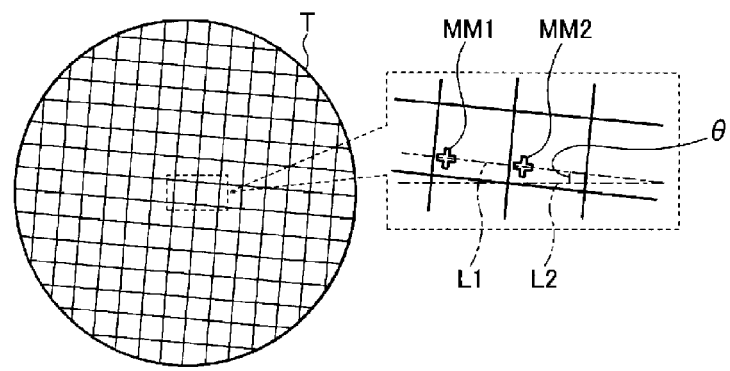
FIG. 4A is a first diagram for describing a mounting angle adjusting processing for the combined wafer according to the exemplary embodiment.
Figure 4B:
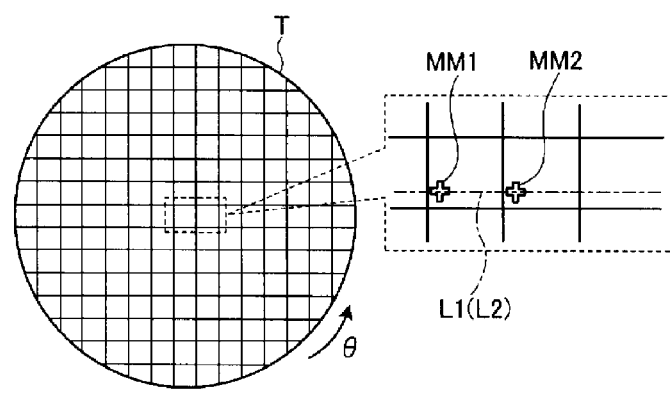
FIG. 4B is a second diagram for describing the mounting angle adjusting processing for the combined wafer according to the exemplary embodiment.

Now, details of a mounting angle adjusting processing for the combined wafer T in the measuring device 1 will be discussed with reference to FIG. 4A and FIG. 4B. FIG. 4A and FIG. 4B are a first diagram and a second diagram for describing the mounting angle adjusting processing for the combined wafer T according to the exemplary embodiment.

As shown in FIG. 4A, a macro mark MM1 provided at a center shot at a central portion of the combined wafer T and a macro mark MM2 provided at a shot adjacent to this center shot are imaged by the macro camera of the imaging unit 20.

Since the macro camera of the imaging unit 20 has the deep depth of focus, it is capable of focusing on even the macro marks MM1 and MM2 provided within the combined wafer T without any problems.

The controller 51 recognizes positions of these macro marks MM1 and MM2, and obtains a straight line L1 connecting the macro marks MM1 and MM2. Further, the controller 51 calculates an angle θ between the calculated straight line L1 and a preset straight line L2 as a reference line.

Then, as shown in FIG. 4B, the controller 51 controls the substrate holder 10 to rotate the combined wafer T by the calculated angle θ, thus making the straight line L1 and the straight line L2 coincide with each other. Accordingly, a mounting angle of the combined wafer T held by the substrate holder 10 can be corrected to zero degree.

<Measurement Mark Position Setting Processing>

Figure 5:
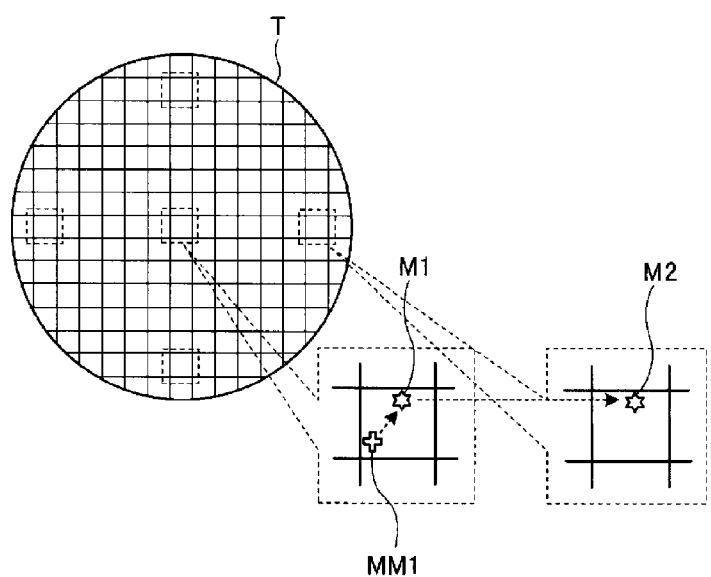
FIG. 5 is a diagram for describing a measurement mark position setting processing according to the exemplary embodiment.

Now, a processing of setting positions of a plurality of measurement marks M provided within the combined wafer T in the measuring device 1 will be explained in detail with reference to FIG. 5. FIG. 5 is a diagram for describing this measurement mark position setting processing according to the exemplary embodiment.

As depicted in FIG. 5, as for the combined wafer T having the mounting angle corrected to the zero degree, the controller 51 calculates a position of a measurement mark M1 provided at the center shot based on the position of the macro mark MM1 of the center shot imaged by the macro camera of the imaging unit 20.

To elaborate, information upon a positional relationship between the macro mark MM1 and the measurement mark M1 at the center shot is previously stored in the storage 52. By reading out this positional relationship, the controller 51 is capable of calculating the position of the measurement mark M1.

Then, based on the position of the measurement mark M1 at the center shot, the controller 51 calculates a position of another measurement mark M2 provided at another shot. To elaborate, based on a positional relationship between the center shot and the another shot (for example, the another shot is located to the right by six shots), the controller 51 is capable of calculating a position of the measurement mark M2 by using this positional relationship and a size of a single shot.

As stated above, the controller 51 is capable of calculating positions of other measurement marks M2 provided at previously set multiple shots (for example, four places at the front, the rear, the left and the right of the center shot) within the combined wafer T. In the following description, the measurement mark M1 and the measurement marks M2 will sometimes be referred to as the measurement mark M.

<Focusing Processing>

Now, details of a processing of focusing on the measurement mark M in the measuring device 1 will be described with reference to FIG. 6A to FIG. 6D. FIG. 6A to FIG. 6D are first to fourth diagrams for describing the focusing processing according to the exemplary embodiment.

Figure 6A:
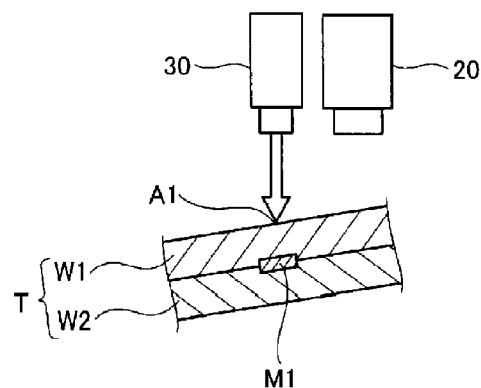
FIG. 6A is a first diagram for describing a focusing processing according to the exemplary embodiment.

First, as shown in FIG. 6A, the controller 51 controls the substrate holder 10 to place the displacement meter 30 at a position directly above a position where the measurement mark M1 of the center shot is located. To elaborate, by horizontally moving the combined wafer T held by the substrate holder 10, the displacement meter 30 is placed directly above the position where the measurement mark M1 is located.

Though the following example will be described for a case where the measurement mark M1 of the center shot is first imaged and the measurement mark M2 of the another shot is then imaged, a sequence of imaging the measurement mark M is not limited thereto. In this case, the measurement mark M measured first is regarded as the measurement mark M1, and the measurement mark M measured subsequently is regarded as the another measurement mark M2.

Further, by moving not the combined wafer T but the displacement meter 30 horizontally, the displacement meter 30 may be placed directly above the position where the measurement mark M1 is located.

By operating the displacement meter 30, the controller 51 measures a displacement A1 of the surface of the combined wafer T at the position where the measurement mark M1 is located. Further, this displacement A1 is a surface displacement at the imaging unit 20 side in the combined wafer T, for example, a surface displacement at the upper wafer W1 side.

Figure 6B:
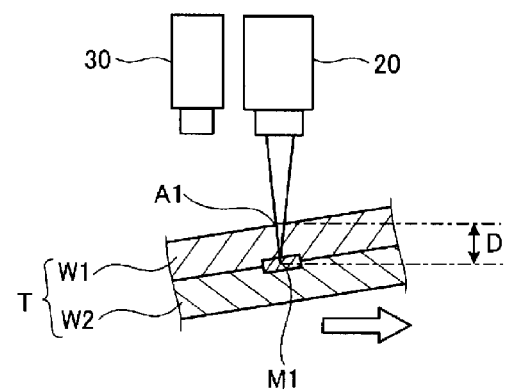
FIG. 6B is a second diagram for describing the focusing processing according to the exemplary embodiment.

Then, the controller 51 controls the substrate holder 10 to place the imaging unit 20 at the position directly above the position where the measurement mark M1 is located (that is, at a position where the measurement mark M1 can be imaged), as shown in FIG. 6B.

To elaborate, by moving the combined wafer T held by the substrate holder 10 horizontally, the controller 51 places the imaging unit 20 at the position directly above the position where the measurement mark M1 is located. Alternatively, by moving not the combined wafer T but the imaging unit 20 horizontally, the imaging unit 20 may be placed directly above the position where the measurement mark M1 is placed.

Then, by operating the micro camera of the imaging unit 20, the controller 51 images the measurement mark M1 while moving a focal position back and forth with respect to a focal position previously set based on the calculated displacement A1. By way of example, the imaging unit 20 images the measurement mark M1 while moving the focal position back and forth within a range of ±20 μm with respect to a previously set depth (for example, +775 μm) which is stored in the storage 52 as a thickness of the upper wafer W from the displacement A1.

Here, in the present exemplary embodiment, when measuring the displacement A1 of the surface, the displacement meter 30 is placed directly above the position where the measurement mark M1 is placed. Further, when imaging the measurement mark M1, the imaging unit 20 is placed directly above the position where the measurement mark M1 is placed.

As stated above, the combined wafer T is maintained in a bent state to be upwardly concave as it is held in the suspended state by the substrate holder 10. That is, as depicted in FIG. 6A and FIG. 6B, since the surface of the combined wafer T is not necessarily flat, there is a concern that a displacement of a surface as a reference of a focal position may not be of an accurate value when the measurement of the displacement of the surface and the imaging of the measurement mark are both performed without moving the combined wafer T.

Thus, according to the exemplary embodiment, by performing the measurement of the displacement A1 and the imaging of the measurement mark M1 while moving the combined wafer T individually, it is possible to efficiently focus on the measurement mark M1 which is provided within the combined wafer T.

Explanation of the focusing processing upon the measurement mark M will be continued. If the measurement mark M1 which is in focus (that is, having a maximum edge intensity) is imaged, the controller 51 investigates a thickness D of the upper wafer W1 based on the depth of focus in the imaging unit 20 when the measurement mark M1 is in focus. By way of example, the controller 51 may calculate the thickness D of the upper wafer W1 from a difference between the displacement A1 of the surface and the focal depth based on this displacement A1.

Figure 6C:
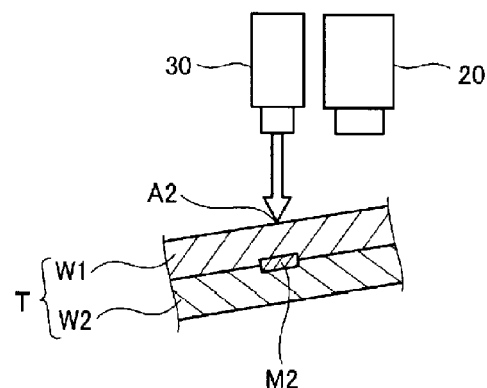
FIG. 6C is a third diagram for describing the focusing processing according to the exemplary embodiment.

Subsequently, the controller 51 controls the substrate holder 10 to place the displacement meter 30 at a position directly above a position where the measurement mark M2 of the another shot is placed, as illustrated in FIG. 6C. To be specific, by horizontally moving the combined wafer T held by the substrate holder 10 with respect to the position of the another measurement mark M2 which is set through the above-described measurement mark position setting processing, the displacement meter 30 is placed directly above the position where the measurement mark M2 is located.

Then, by operating the displacement meter 30, the controller 51 measures another displacement A2 of the surface of the combined wafer T at the position where the another measurement mark M2 is located.

Figure 6D:
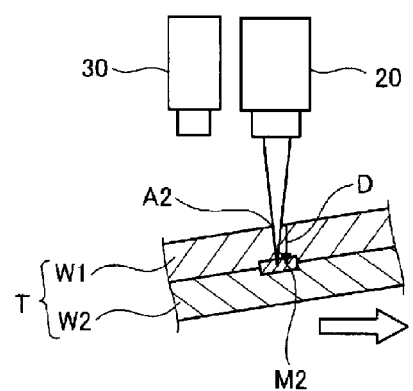
FIG. 6D is a fourth diagram for describing the focusing processing according to the exemplary embodiment.

Thereafter, the controller 51 controls the substrate holder 10 to place the imaging unit 20 at a position directly above the position where the measurement mark M2 is located (that is, at a position where the measurement mark M2 can be imaged), as shown in FIG. 6D. To elaborate, by horizontally moving the combined wafer T held by the substrate holder 10, the imaging unit 20 is placed directly above the position where the measurement mark M2 is located.

Then, by operating the micro camera of the imaging unit 20, the controller 51 images the measurement mark M2 while putting the measurement mark M2 in focus by moving the focal position back and forth with respect to a position as deep as the previously investigated thickness D of the upper wafer W1 from the displacement A2 calculated by the displacement meter 30.

As described above, when imaging the another measurement mark M2 measured for the second or more time, the more accurate focal position can be set based on the thickness D of the upper wafer W1 which is investigated when the first measurement mark M1 is imaged. It is because the thickness D of the upper wafer W1 is substantially uniform within the single combined wafer T while the thickness D is different between different combined wafers T.

Accordingly, in the present exemplary embodiment, a range in which the depth of focus is moved back and forth can be made smaller (e.g., ±6 μm) when the another measurement mark M2 is imaged, as compared to the time when the measurement mark M1 is imaged for the first time. Thus, according to the exemplary embodiment, the focusing on the another measurement mark M2 measured for the second or more time can be carried out more efficiently.

<Position Deviation Investigating Processing>

Figure 7A:
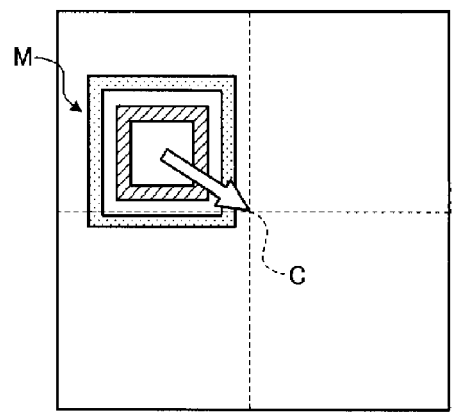
FIG. 7A is a first diagram for describing a position deviation investigating processing according to the exemplary embodiment.
Figure 7B:
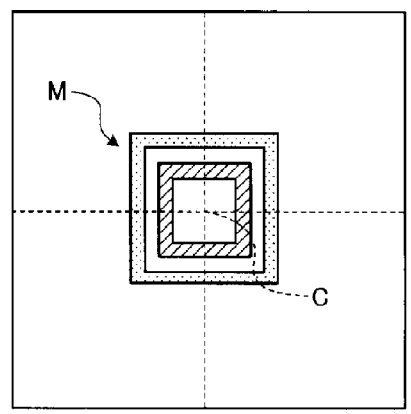
FIG. 7B is a second diagram for describing the position deviation investigating processing according to the exemplary embodiment.
Figure 7C:
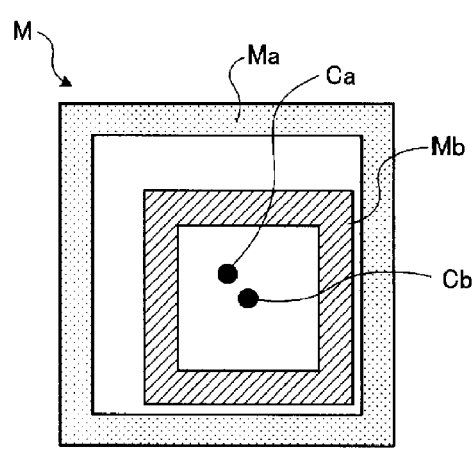
FIG. 7C is a third diagram for describing the position deviation investigating processing according to the exemplary embodiment.

Now, details of a processing of investigating a position deviation amount between the upper wafer W1 and the lower wafer W2 based on the imaged measurement mark M will be explained with reference to FIG. 7A to FIG. 7C. FIG. 7A to FIG. 7C are first to third diagrams for describing the position deviation investigating processing according to the exemplary embodiment.

As depicted in FIG. 7A, the measurement mark M put in focus through the above-described focusing processing may be deviated from a center C in an angle of view of the micro camera of the imaging unit 20.

Thus, the controller 51 controls the substrate holder 10 to move the combined wafer T such that a center of the measurement mark M and the center C in the angle of view of the micro camera are coincident. Accordingly, as shown in FIG. 7B, the measurement mark M can be imaged in the state that the center of the measurement mark M and the center C of the angle of view are coincident.

Subsequently, the controller 51 calculates a position of a center Ca of the upper mark Ma and a position of a center Cb of the lower mark Mb in the imaged measurement mark M, as shown in FIG. 7C. Then, based on the calculated positions of the centers Ca and Cb, the controller 51 investigates the position deviation amount between the upper mark Ma and the lower mark Mb in the measurement mark M.

Further, the controller 51 may investigate the position deviation amount between the upper wafer W1 and the lower wafer W2 based on position deviation amounts between the upper mark Ma and the lower mark Mb investigated in multiple measurement marks M at different positions.

The measuring device 1 according to the exemplary embodiment is equipped with the substrate holder 10, the imaging unit 20, the displacement meter 30, and the light source 40. The substrate holder 10 includes the main body 11 having the opening 11a larger than the combined substrate (combined wafer T) formed of the two sheets of substrates bonded to each other; and the multiple number of holding arms 12 elongated inwards from the main body 11 into the opening 11a and configured to hold the peripheral portion of the combined substrate. The imaging unit 20 is configured to image the measurement mark M1 for the position deviation measurement which is provided within the combined substrate (combined wafer T) held by the substrate holder 10. The displacement meter 30 is provided at the same side as the imaging unit 20 with respect to the combined substrate (combined wafer T) held by the substrate holder 10, and configured to measure the displacement A1 of the surface of the combined substrate at the position where the measurement mark M1 is placed. The light source 40 is disposed at the opposite side from the imaging unit 20 with respect to the combined substrate (combined wafer T) held by the substrate holder 10, and configured to radiate the infrared light to the combined substrate. Thus, it is possible to provide the measuring device 1 capable of efficiently focusing on the measurement mark M1 provided within the combined wafer T.

Modification Example

Figure 8A:
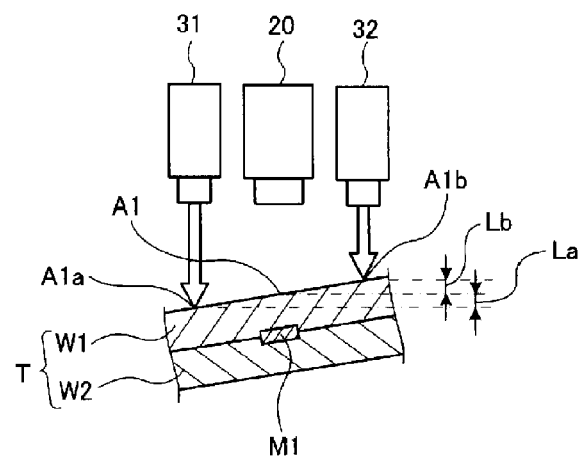
FIG. 8A is a first diagram for describing a focusing processing according to a modification example of the exemplary embodiment.
Figure 8B:
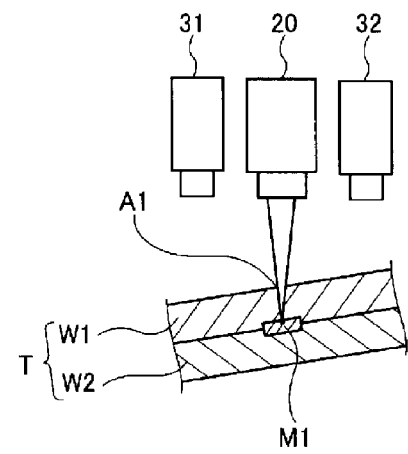
FIG. 8B is a second diagram for describing the focusing processing according to the modification example of the exemplary embodiment.

Now, details of a focusing processing according to a modification example of the exemplary embodiment will be explained with reference to FIG. 8A and FIG. 8B. FIG. 8A and FIG. 8B are first and second diagrams for describing the focusing processing according to the modification example of the exemplary embodiment.

As depicted in FIG. 8A, in the modification example, the displacement A1 of the surface at the position where the measurement mark M1 is provided is investigated by using two displacement meters 31 and 32. These two displacement meters 31 and 32 are disposed such that the imaging unit 20, for example, is located therebetween.

The controller 51 controls the substrate holder 10 to place the imaging unit 20 at the position directly above the position where the measurement mark M1 is located. Then, by operating the two displacement meters 31 and 32, the controller 51 measures displacements A1a and A1b of the surface near the position where the measurement mark M1 is provided.

Then, the controller 51 investigates the displacement A1 of the surface directly under the imaging unit 20 based on these two measured displacements A1a and A1b. By way of example, in case that the two displacement meters 31 and 32 are arranged such that the imaging unit 20 is located therebetween, a value allowing a distance La as a difference between the displacements A1a and A1 and a distance Lb as a difference between the displacements A1b and A1 to become equal to each other may be calculated as the displacement A1.

Subsequently, as shown in FIG. 8B, by operating the micro camera of the imaging unit 20, the controller 51 images the measurement mark M1 while putting the measurement mark M1 in focus by moving the focal position back and forth with respect to the focal position previously set based on the calculated displacement A1.

That is, in this modification example, by using the two displacement meters 31 and 2, the measurement of the displacement A1 and the imaging of the measurement mark M1 can be both performed without moving the combined wafer T individually even if the surface of the combined wafer T is inclined.

Furthermore, the above modification example has been described for the case where the displacement A1 for the measurement mark M1 measured for the first time is investigated. However, the same method may also be applicable to a case where another displacement A2 of the another measurement mark M2 measured for the second or more time is investigated.

<Details of Measuring Processing>

Figure 9:
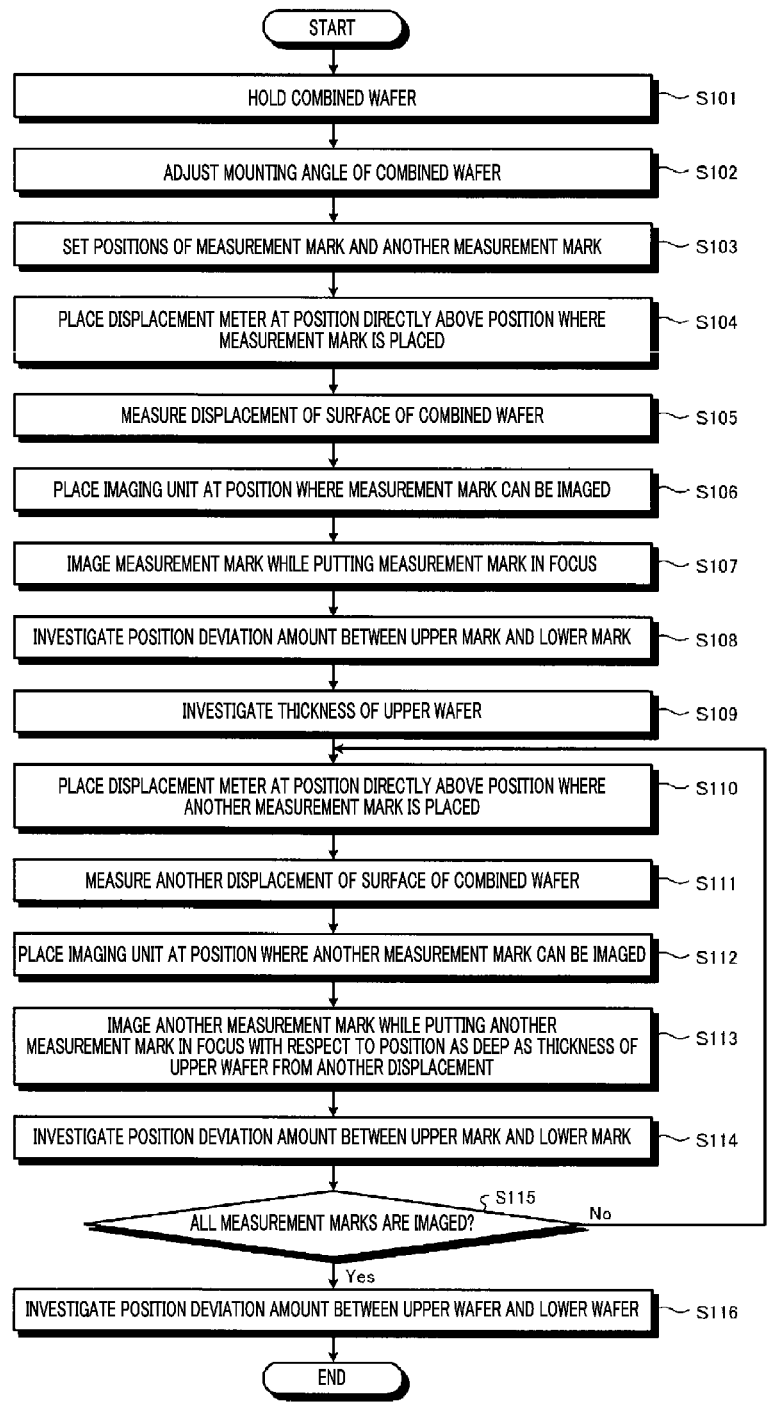
FIG. 9 is a flowchart illustrating a processing sequence of a processing performed by the measuring device according to the exemplary embodiment.

Now, referring to FIG. 9 and FIG. 10, details of a measuring processing according to the exemplary embodiment and the modification example will be described. FIG. 9 is a flowchart illustrating a processing sequence of a processing performed by the measuring device 1 according to the exemplary embodiment.

First, by operating the lifter 60 and the supply arm 70, the controller 51 allows the combined wafer T to be carried onto the substrate holder 10 and held by the holding arms 12 of the substrate holder 10 (process S101). Then, the controller 51 adjusts the mounting angle of the combined wafer T held by the substrate holder 10 by operating the imaging unit 20 and the substrate holder 10 (process S102).

Thereafter, the controller 51 sets the position of the measurement mark M1 and the position of the measurement mark M2 through the above-described measurement mark position setting processing (process S103). Then, by operating the substrate holder 10, the controller 51 places the displacement meter 30 at the position directly above the position where the measurement mark M1 is located (process S104).

Afterwards, by operating the displacement meter 30, the controller 51 measures the displacement A1 of the surface of the combined wafer T at the position where the measurement mark M1 is placed (process S105). Then, by operating the substrate holder 10, the controller 51 locates the imaging unit 20 at the position where the measurement mark M1 can be imaged (that is, at the position directly above the position where the measurement mark M1 is placed) (process S106).

Subsequently, by operating the micro camera of the imaging unit 20, the controller 51 images the measurement mark M1 while putting the measurement mark M1 in focus by moving the focal position back and forth with respect to the focal position previously set based on the displacement A1 (process S107). Then, the controller 51 calculates the position deviation amount between the upper mark Ma and the lower mark Mb in the measured measurement mark M1 (process S108).

Thereafter, based on the depth of focus in the imaging unit 20 when the measurement mark M1 is in focus, the controller 51 calculates the thickness D of the upper wafer W1 (process S109). Then, the controller 51 controls the substrate holder 10 to locate the displacement meter 30 at the position directly above the position where the another measurement mark M2 is placed (process S110).

Next, by operating the displacement meter 30, the controller 51 measures the another displacement A2 of the surface of the combined wafer T at the position where the measurement mark M2 is placed (process S111). Then, the controller 51 controls the substrate holder 10 to place the imaging unit 20 at the position where the measurement mark M2 can be imaged (that is, at the position directly above the position where the measurement mark M2 is located) (process S112).

Then, by operating the micro camera of the imaging unit 20, the controller 51 images the measurement mark M2 while putting the measurement mark M2 in focus by moving the focal position back and forth with respect to the position as deep as the thickness D of the upper wafer W1 from the another displacement A2 (process S113). Thereafter, the controller 51 calculates the position deviation amount between the upper mark Ma and the lower mark Mb in the imaged measurement mark M2 (process S114).

Thereafter, the controller 51 determines whether all measurement marks M required to investigate the position deviation amount are imaged in the plurality of measurement marks M provided in the combined wafer T (process S115).

If all the measurement marks M are imaged (process S115, Yes), the controller 51 calculates the position deviation amount between the upper wafer W1 and the lower wafer W2 based on the position deviation amount between the upper mark Ma and the lower mark Mb in each measurement mark M (process S116). Then, the controller 51 completes the processing.

Meanwhile, if all the measurement marks M are not imaged yet (process S115, No), the processing is returned back to the process S110.

The measuring method according to the exemplary embodiments includes the process (process S105) of measuring the displacement A1, the process (process S106) of placing the imaging unit 20 at the position where the measurement mark M1 can be imaged; and the process (process S107) of imaging the measurement mark M1. In the process of measuring the displacement A1, the displacement A1 of the surface of the combined substrate (combined wafer T) at the imaging unit 20 side is measured at the position where the measurement mark M1 for the position deviation measurement, which is provided within the combined substrate (combined wafer T) composed of the two bonded substrates, is placed. In the process of imaging the measurement mark M1, the measurement mark M1 is imaged by the imaging unit 20 while bringing the measurement mark M1 in focus by moving the focal position back and forth with respect to the focal position previously set based on the displacement A1. Accordingly, it is possible to focus on the measurement mark M1 provided within the combined wafer T efficiently.

Further, in the measuring method according the exemplary embodiment, in the process (process S105) of measuring the displacement A1, the displacement A1 of the surface at the position where the mark (measurement mark M1) is placed is measured by the single displacement meter 30. Further, in the process (process S106) of placing the imaging unit 20 at the position where the measurement mark M1 can be imaged, the placing is carried out by moving the combined substrate (combined wafer T) or the imaging unit 20. Accordingly, the displacement A1 serving as the reference of the focal position can be calculated more accurately.

Moreover, the measuring method according to the exemplary embodiment further includes the process (process S109) of calculating the thickness D, the process (process S111) of measuring the another displacement A2, the process (process S112) of placing the imaging unit 20 at the position where the measurement mark M2 can be imaged, and the process (process S113) of imaging the another measurement mark M2. In the process (process S109) of calculating the thickness D, based on the displacement A1 and the focal position where the measurement mark M1 is in focus, the thickness D of the substrate (upper wafer W1) at the imaging unit 20 side in the combined substrate (combined wafer T) is calculated. In the process (process S111) of measuring the another displacement A2, the another displacement A2 of the surface at the position where the another measurement mark M2 for the position deviation measurement, which is provided within the combined substrate (combined wafer T), is placed is measured. In the process (process S113) of imaging the another measurement mark M2, the another measurement mark M2 is imaged by the imaging unit 20 while putting the measurement mark M2 in focus by moving the focal position back and forth with respect to the position as deep as the thickness D of the substrate at the imaging unit 20 side (upper wafer W1) from the displacement A2. Accordingly, the measurement mark M2 measured for the second or more time can be put into focus more efficiently.

In addition, in the measuring method according to the exemplary embodiment, in the process (process S113) of imaging the another measurement mark M2, the range in which the focal position is moved back and forth is smaller than the range in the process (process S107) of imaging the measurement mark M1. Accordingly, the measurement mark M2 measured for the second or more time can be put into focus in a shorter period of time.

FIG. 10 is a flowchart illustrating a processing sequence of a processing performed by the measuring device 1 according to the modification example of the exemplary embodiment.

First, by operating the lifter 60 and the supply arm 70, the controller 51 allows the combined wafer T to be carried onto the substrate holder 10 and held by the holding arms 12 of the substrate holder 10 (process S201). Then, the controller 51 adjusts the mounting angle of the held combined wafer T by operating the imaging unit 20 and the substrate holder 10 (process S202).

Thereafter, the controller 51 sets the position of the measurement mark M1 and the position of the measurement mark M2 through the above-described measurement mark position setting processing (process S203). Then, by operating the substrate holder 10, the controller 51 places the imaging unit 20 at the position where the measurement mark M1 can be imaged (that is, at the position directly above the measurement mark M1 is placed) (process S204).

Afterwards, by using the two displacement meters 31 and 32, the controller 51 measures the displacements A1a and A1b of the surface of the combined wafer T near the position where the measurement mark M1 is placed (process S205). Then, based on the two measured displacements A1a and A1b, the controller 51 investigates the displacement A1 of the surface at the position where the measurement mark M1 is placed. (process S206).

Subsequently, by operating the micro camera of the imaging unit 20, the controller 51 images the measurement mark M1 while putting the measurement mark M1 in focus by moving the focal position back and forth with respect to the focal position previously set based on the displacement A1 (process S207). Then, the controller 51 calculates the position deviation amount between the upper mark Ma and the lower mark Mb in the measured measurement mark M1 (process S208).

Thereafter, based on the depth of focus in the imaging unit 20 when the measurement mark M1 is in focus, the controller 51 calculates the thickness D of the upper wafer W1 (process S209). Then, the controller 51 controls the substrate holder 10 to locate the imaging unit 20 at the position where the other measurement mark M2 can be imaged (that is, directly above the position where the other measurement mark M2 is placed) (process 210).

Next, by using the displacement metes 31 and 32, the controller 51 measures the displacements of the surface of the combined wafer T near the position where the measurement mark M2 is placed (process S211). Then, based on the two measured displacements, the controller 51 investigates the another displacement A2 of the surface at the position where the another measurement mark M2 is placed (process S212).

Then, by operating the micro camera of the imaging unit 20, the controller 51 images the measurement mark M2 while putting the measurement mark M2 in focus by moving the focal position back and forth with respect to the position as deep as the thickness D of the upper wafer W1 from the another displacement A2 (process S213). Thereafter, the controller 51 calculates a position deviation amount between the upper mark Ma and the lower mark Mb in the imaged measurement mark M2 (process S214).

Thereafter, the controller 51 determines whether all measurement marks M required to investigate the position deviation amount are imaged in the plurality of measurement marks M provided in the combined wafer T (process S215).

If all the measurement marks M are imaged (process S215, Yes), the controller 51 calculates the position deviation amount between the upper wafer W1 and the lower wafer W2 based on the position deviation amount between the upper mark Ma and the lower mark Mb in each measurement mark M (process S216). Then, the controller 51 completes the processing.

Meanwhile, if all the measurement marks M are not imaged yet (process S215, No), the processing is returned back to the above-described process S210.

In the measuring method according to the modification example of the exemplary embodiment, in the processes S205 and S206 of measuring the displacement A1, the displacements A1a and A1b of the surface near the position where the measurement mark M1 is placed are respectively measured by the displacement meters 31 and 32. Then, based on the two measured displacements A1a and A1b, the displacement A1 of the surface at the position where the measurement mark M1 is placed is investigated. Accordingly, the measurement of the displacement A1 and the imaging of the measurement mark M1 can be carried out without needing to move the combined wafer T each time.

Furthermore, in the measuring method according to the modification example of the exemplary embodiment, the two displacement meters 31 and 32 are arranged such that the imaging unit 20 is located therebetween. With this configuration, the displacement A1 can be simply investigated.

So far, the exemplary embodiment of the present disclosure has been described. However, it should be noted that the present disclosure is not limited to the exemplary embodiment, and various changes and modifications may be made without departing from the scope of the present disclosure. By way of example, though the above exemplary embodiment has been descried for the case where the measurement mark M is imaged for the combined wafer T which is held in the suspended state, the state in which the combined wafer T is held is not limited to the suspended state.

It will be appreciated that the exemplary embodiments of the present disclosure is illustrative only and is not intended to be limiting. Various modifications may be made therefrom. Further, the above-described exemplary embodiment may be omitted, substituted or changed in various ways without departing from the scope and spirit of the following claims.

EXPLANATION OF CODES

According to the exemplary embodiments, it is possible to efficiently focus on a measurement mark which is provided within a combined substrate.

We claim:

1. A measuring method, comprising:
    measuring a displacement of a surface of a combined substrate, which is composed of two sheets of substrates bonded to each other, on a side of an imaging unit comprising two cameras at a position where a measurement mark for position deviation measurement, which is provided within the combined substrate, is placed;
    placing the imaging unit at a position where the imaging unit is allowed to image the measurement mark;
    imaging the measurement mark by the imaging unit while putting the measurement mark in focus by moving a focal position back and forth with respect to a focal position which is previously set based on the displacement;
    investigating a thickness of the substrate at the side of the imaging unit between the two sheets of substrates of the combined substrate based on the displacement and the focal position where the measurement mark is in focus;
    measuring another displacement of the surface at a position where another measurement mark for position deviation measurement, which is provided within the combined substrate, is placed;
    placing the imaging unit at a position where the imaging unit is allowed to image the another measurement mark; and
    imaging the another measurement mark by the imaging unit while putting the another measurement mark in focus by moving the focal position back and forth with respect to a position as deep as the thickness of the substrate at the side of the imaging unit from the another displacement.

2. The measuring method of claim 1,
    wherein in the measuring of the displacement, the displacement of the surface at the position where the measurement mark is placed is measured by using a single displacement meter, and
    the placing of the imaging unit at the position where the imaging unit is allowed to image the measurement mark is carried out by moving the combined substrate or the imaging unit.

3. The measuring method of claim 1,
    wherein in the measuring of the displacement, the displacement of the surface near the position where the measurement mark is placed is measured by using two displacement meters, and the displacement of the surface at the position where the measurement mark is placed is investigated based on two measured displacements.

4. The measuring method of claim 3,
    wherein the two displacement meters are arranged such that the imaging unit is placed therebetween.

5. The measuring method of claim 1,
    wherein in the imaging of the another measurement mark, a range in which the focal position is moved back and forth is smaller than a range in the imaging of the measurement mark.

6. A measuring device, comprising:
    a substrate holder including a main body having an opening larger than a combined substrate composed of two sheets of substrates bonded to each other, and multiple holding arms elongated inwards from the main body into the opening and configured to hold a peripheral portion of the combined substrate;
    an imaging unit, comprising two cameras, configured to image a measurement mark for position deviation measurement which is provided within the combined substrate held by the substrate holder and configured to put the measurement mark in focus by moving a focal position back and forth with respect to a focal position which is previously set based on a displacement of a surface of the combined substrate;
    a laser displacement meter provided at a same side as the imaging unit with respect to the combined substrate held by the substrate holder, and configured to measure the displacement of a surface of the combined substrate at a position where the measurement mark is placed;
    a light source provided at an opposite side from the imaging unit with respect to the combined substrate held by the substrate holder, and configured to radiate infrared light to the combined substrate; and
    a controller configured to investigate a thickness of the substrate at the side of the imaging unit between the two sheets of substrates of the combined substrate based on the displacement and the focal position where the measurement mark is in focus,
    wherein the laser displacement meter is further configured to measure another displacement of the surface at a position where another measurement mark for position deviation measurement, which is provided within the combined substrate, is placed
    the controller is further configured to place the imaging unit at a position where the imaging unit is allowed to image the another measurement mark, and
    the imaging unit is further configured to image the another measurement mark by the imaging unit while putting the another measurement mark in focus by moving the focal position back and forth with respect to a position as deep as the thickness of the substrate at the side of the imaging unit from the another displacement.

* * * * *